(12) United States Patent
Mayer et al.

(10) Patent No.: US 9,185,319 B2
(45) Date of Patent: Nov. 10, 2015

(54) PIXEL-GROUPING IMAGE SENSOR

(75) Inventors: Frédéric Mayer, Voiron (FR); Marie Guillon, Grenoble (FR)

(73) Assignee: E2V SEMICONDUCTORS, Saint-Égrève (FR)

( * ) Notice: Subject to any disclaimer, the term of this patent is extended or adjusted under 35 U.S.C. 154(b) by 74 days.

(21) Appl. No.: 14/240,919

(22) PCT Filed: Jul. 25, 2012

(86) PCT No.: PCT/EP2012/064618
§ 371 (c)(1),
(2), (4) Date: Feb. 25, 2014

(87) PCT Pub. No.: WO2013/029885
PCT Pub. Date: Mar. 7, 2013

(65) Prior Publication Data
US 2014/0218580 A1 Aug. 7, 2014

(30) Foreign Application Priority Data
Aug. 26, 2011 (FR) ...................... 11 57549

(51) Int. Cl.
*H04N 5/355* (2011.01)
*H04N 5/374* (2011.01)
*H01L 27/146* (2006.01)
*H04N 5/347* (2011.01)
*H04N 5/3745* (2011.01)

(52) U.S. Cl.
CPC .......... *H04N 5/374* (2013.01); *H01L 27/14603* (2013.01); *H01L 27/14614* (2013.01); *H04N 5/347* (2013.01); *H04N 5/3559* (2013.01); *H04N 5/3745* (2013.01); *H04N 5/37452* (2013.01)

(58) Field of Classification Search
CPC ... H04N 5/3532; H04N 5/3537; H04N 9/045; H04N 5/347; H04N 21/4318; H04N 5/213; H04N 5/2355; H04N 5/3452; H04N 5/3458; H04N 5/374; H04N 5/3745; H04N 5/37452; H04N 5/3559; H01L 27/14603; H01L 27/14
USPC ........... 348/223.1, 272, 231.99, 308, E05.091
See application file for complete search history.

(56) References Cited

U.S. PATENT DOCUMENTS 5,134,087 A 7/1992 Hynecek
6,452,153 B1 9/2002 Lauxtermann et al.
(Continued)

FOREIGN PATENT DOCUMENTS

EP 2037672 A1 3/2009
GB 2474014 A 4/2011
WO 0228095 A2 4/2002

OTHER PUBLICATIONS

International Search Report for PCT/EP2012/064618 dated Oct. 26, 2012.

*Primary Examiner* — Hung Lam
(74) *Attorney, Agent, or Firm* — Hauptman Ham, LLP

(57) ABSTRACT

The invention relates to matrix image sensors organized into pixel rows and columns, and more specifically to image sensors produced with active pixels in MOS technology. The matrix is organized into groups of at least two pixels with means for grouping the charges engendered in the two pixels into one pixel, with the aim of improving sensitivity. Provision is made for at least one gate for temporarily storing charges, of dissymmetric form, arranged between the photodiode of the first pixel and the photodiode of the second pixel, and means for applying to the temporary storage gate a succession of potentials that allow prohibition first of all of the passage of charges between the first and second photodiodes during the charge integration period, then collection, under the gate, of the charges accumulated in the photodiodes, then discharge of these charges only into the second photodiode, on account of the dissymmetry of the gate. The charges grouped in this way in a single photodiode are read in the pixel.

8 Claims, 5 Drawing Sheets

(56) References Cited

U.S. PATENT DOCUMENTS

| | | | |
|---|---|---|---|
| 7,989,749 B2* | 8/2011 | Yin et al. | 250/208.1 |
| 8,625,016 B2* | 1/2014 | Fossum et al. | 348/308 |
| 2003/0020000 A1 | 1/2003 | Kozuka | |
| 2004/0135063 A1 | 7/2004 | Dosluoglu | |
| 2007/0131992 A1 | 6/2007 | Dosluoglu et al. | |
| 2009/0021612 A1* | 1/2009 | Hamilton et al. | 348/249 |
| 2009/0053848 A1* | 2/2009 | Fan | 438/59 |
| 2009/0073281 A1 | 3/2009 | Ohno | |
| 2010/0252718 A1* | 10/2010 | Lee | 250/208.1 |

* cited by examiner

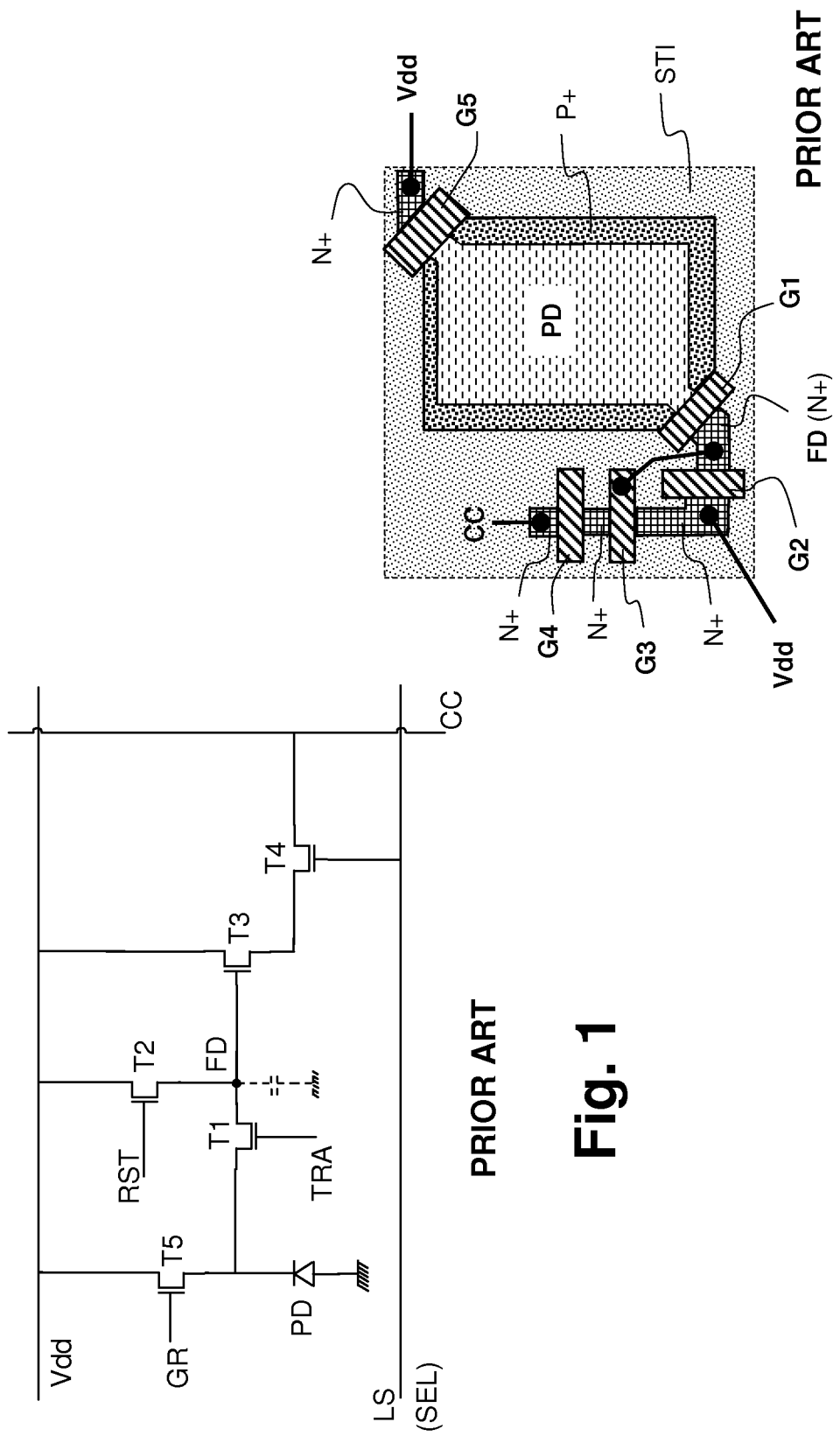

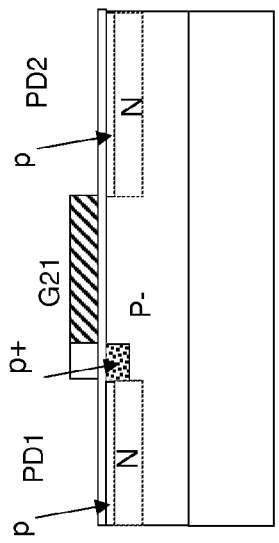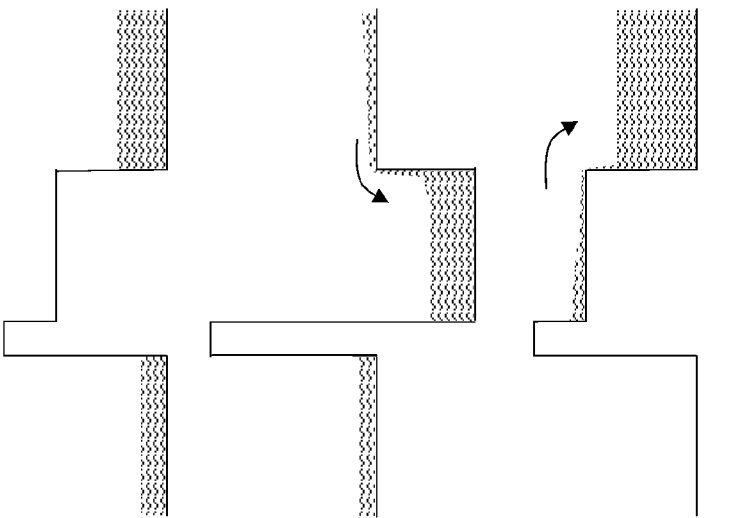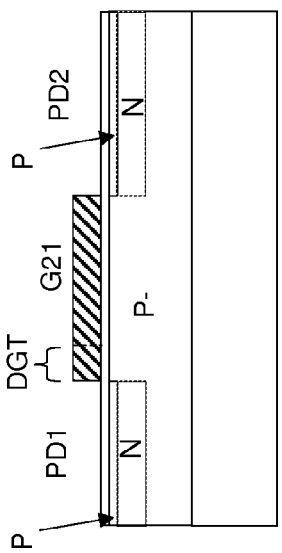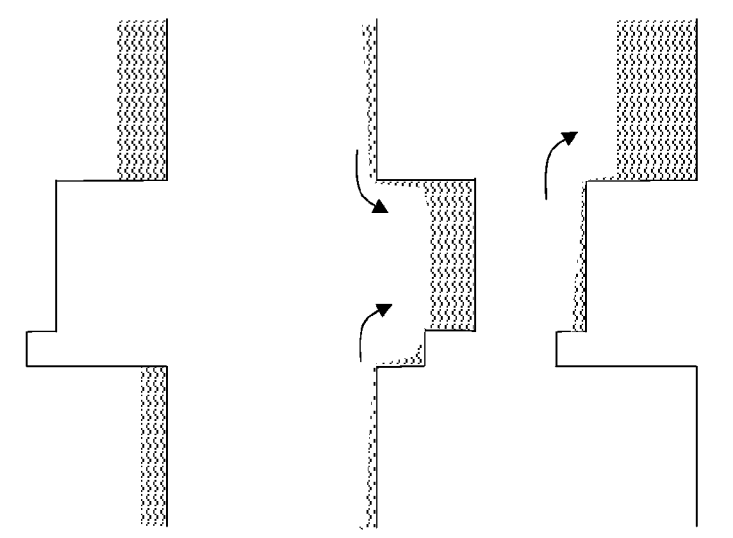
Fig. 6

PIXEL-GROUPING IMAGE SENSOR

FIELD

The invention relates to matrix image sensors organized into pixel rows and columns, and more specifically to image sensors produced with active pixels in MOS technology, in which each pixel comprises at least one photodiode and transistors that are used to perform charge/voltage conversion in the pixel.

BACKGROUND

It has already been proposed to produce matrix sensors in which the resolution and sensitivity can be modified as chosen by the user by grouping a plurality of neighboring pixels. For a better resolution, the pixels are read independently of one another. For better sensitivity at the cost of lower resolution, the pixels are grouped and supply a single signal for each group of pixels. The adjacent pixels can be grouped 2 by 2 or 4 by 4 or more generally m by n, m and n being two integers, at least one of which is greater than or equal to 2.

The grouping of pixels (or "binning") has been used in CCD (charge transfer device) technologies, where it is particularly effective because it allows photogenerated charges to be added by simple charge transfer. In active pixel MOS technologies, it is more complicated because the output signal from the pixels is a voltage; if the voltage is digitized and a plurality of digital signals are added in order to group pixels, the noise is likewise added.

However, even in active pixel MOS technologies, charge transfer structures have been proposed that allow unlimited grouping, in analog form, of photogenerated charges in a plurality of pixels. Charges are grouped by sharing the charge storage nodes of adjacent pixels before converting the charges into voltage; the disadvantage of the proposed devices is that this complicates the reading of the individual pixels when there is no wish to group them; moreover, these devices exhibit a lower charge/voltage conversion factor when the pixels are grouped than when they remain separate.

By way of example, the patent GB2474014 has proposed an architecture allowing conditional sharing of the charges between two pixels by means of a transistor that connects or does not connect the charge storage nodes of two adjacent pixels. The capacitance of the charge storage node greatly increases when this sharing is effected, which reduces the charge/voltage conversion factor.

Finally, the patent U.S. Pat. No. 6,452,153 has proposed charge sharing within the framework of a pixel that does not have an isolation transistor between the photodiode and a charge storage node and that, instead of this, has what is known as a "skimming" transistor that is DC-biased. This patent uses an architecture with a grouping transistor that is arranged so as to connect the outputs of a plurality of photodiodes to the read transistor of a single one of the pixels. Although the charge/voltage conversion factor remains the same when the pixels are separate and when they are grouped, the solution described in this patent has a major disadvantage that is low transfer efficiency because the charges on the photodiode that is furthest from the grouping pixel have trouble in reaching the read circuit of this pixel. The untransferred charges would appear in the next image, giving rise to a delay phenomenon that damages the image. Moreover, this structure has very little efficiency at low signal level because it works by skimming charges above a certain level. The grouping of charges is of particular interest at low light level.

SUMMARY

The aim of the present invention is to propose a sensor in which it is possible to group pixels without significantly changing the conversion factor and nevertheless with a good level of transfer efficiency.

The sensor according to the invention allows independent or grouped collection of photogenerated charges in at least two adjacent pixels. It has a temporary storage gate between the photodiodes of the two pixels and control means for this gate. During charge integration, the gate is brought to a potential that prohibits the passage of charges between the photodiodes of the two pixels. The integrated charges in each pixel are read individually if there is no wish to group pixels. If there is a wish to group pixels at the end of a charge integration period, the temporary storage gate receives a temporary storage control signal that brings it to a high potential; on account of this, the charges on the two photodiodes discharge under this gate; then, at the end of the temporary storage control signal, the gate returns to a low potential that has a tendency to evacuate the charges that it had stored. The gate is set up dissymmetrically between its upstream side (side that receives charges) and its downstream side (side that supplies charges) in order to ensure directivity of the charge transfer in this last phase, so that the charges stored under the temporary storage gate set off again only toward a single one of the two photodiodes. The pixel corresponding to the photodiode that has thus grouped the charges of two pixels is then read.

This dissymmetry of the intermediate storage gate preferably consists of creating, under the temporary storage gate and on one side thereof (that will be called the upstream side), a constriction corridor for the passage of charges from the photodiode situated upstream; this corridor is surrounded by doped areas that are brought to a reference potential, and it is sufficiently narrow for the potential in the corridor, influenced by these doped areas on both sides of the corridor, to remain lower than the potential under the gate on the downstream side after the end of the temporary storage signal; thus, a potential barrier is created in the narrow corridor, which forces the charges stored under the temporary storage gate to head from the downstream side.

Therefore, the invention proposes an image sensor having a matrix of pixel rows and columns, each pixel having a photodiode and a node for storing charges in order to collect, at the end of a charge integration period, the charges accumulated in the photodiode, the matrix being organized into groups of at least two pixels with means for grouping the charges engendered in the two pixels into one pixel, this sensor being characterized in that it has a gate for temporarily storing charges, exhibiting dissymmetry between an upstream side and a downstream side, that is arranged between the photodiode of the first pixel and the photodiode of the second pixel, and means for applying to the temporary storage gate a succession of potentials that are:

a low potential prohibiting the passage of charges between the first and second photodiodes during the charge integration period, then a high potential temporary storage control signal permitting the discharge of the charges accumulated in the two photodiodes under the temporary storage gate, then a low potential allowing the discharge of the charges on the intermediate storage gate toward the first photodiode only.

The dissymmetry of the temporary storage gate is understood as being a dissymmetry in the direction of charge transfer, the upstream side being different than the downstream side; this does not exclude symmetry in relation to an axis that is parallel to the direction of charge transfer.

In practice, the photodiodes are produced in an active semiconductor layer of a first conductivity type and have a diffusion of a second conductivity type covered by a superficial layer of the first type connected to a reference potential for the active layer; the temporary storage gate is arranged above an active layer portion of the first type, this active layer portion being:

- adjacent to the photodiode of the first pixel by the end of least one narrow corridor extending toward this photodiode,
- adjacent to the photodiode of the second pixel by a wider side than the narrow corridor,
- and being, with the exception of the end of the narrow corridor, separated from the photodiode of the first pixel by doped insulation regions of the first conductivity type, which are more doped than the superficial layer of the photodiodes, and, like these, are brought to the reference potential of the active layer.

The corridor is sufficiently narrow to set up in the active layer a potential barrier that is higher than on the downstream side. There may be a plurality of narrow corridors on the upstream side, provided that each of them is sufficiently narrow to set up such a potential barrier in the active layer. Doped insulation regions of the first conductivity type separate the photodiode of the active layer portion everywhere outside the end of these narrow corridors.

In one possible embodiment, the matrix is organized into groups of four pixels, a first and a second pixel in a group of four are two adjacent pixels in a first row of pixels and a third and a fourth pixel are two adjacent pixels in a row adjacent to the first, and at least three dissymmetric temporary storage gates (in the sense indicated previously) are provided in order to permit charges on the photodiodes of the four pixels to be grouped into the photodiode of the fourth pixel.

Charges may be grouped in several possible ways, depending on the control of the temporary storage gates.

In one solution, a first temporary storage gate is provided between the first and second pixels, a second gate is provided between the second and third pixels, and a third gate is provided between the third and fourth pixels, and means are provided in order to control the gates in succession, the storage control signal for the second gate being applied to the latter only after the end of the storage control signal applied to the first gate, and the storage control signal for the third gate being applied to the latter only after the end of the storage control signal applied to the second gate. Thus, the charges pass from the first electrode to the second, then to the third and finally to the fourth.

In another solution, a first temporary storage gate is provided between the first and fourth pixels, a second gate is provided between the second and third pixels, and a third gate is provided between the third and fourth pixels, and means are provided in order to control the gates in two successive steps, the storage control signal for the first gate being applied to the latter at the same time as the storage control signal for the second gate, and the storage control signal for the third gate being applied to the latter only after the end of the storage control signal applied to the first and second gates. Thus, the charges pass at the same time from the first and second photodiodes to the fourth and third, respectively; they then pass from the third to the fourth.

Finally, the matrix may likewise be organized into groups of n×m pixels, with (n×m−1) temporary storage gates between the photodiode of the pixel and each of the adjacent pixels. At least (m+n−2) grouping signals are necessary in order to effect the grouping in the last pixel.

In all cases, the charge/voltage conversion factor is the same when the matrix works without grouping pixels and with pixel grouping: it is the conversion factor linked to the capacitance of the charge storage node for the pixel.

BRIEF DESCRIPTION OF DRAWINGS

Other features and advantages of the invention will emerge upon reading the detailed description that follows and that is provided with reference to the appended drawings, in which:

FIG. 1 shows a conventional wiring diagram for an active pixel having five transistors and a photodiode;

FIG. 2 shows a schematic top view of the pixel, showing the various elements of this wiring diagram;

FIG. 6 shows a diagram of the successive potentials in the semiconductor in the course of a grouping operation, with the potentials along the line A-A on the left of the figure and the potentials along the line B-B on the right;

DESCRIPTION OF EMBODIMENTS

Figure 4:
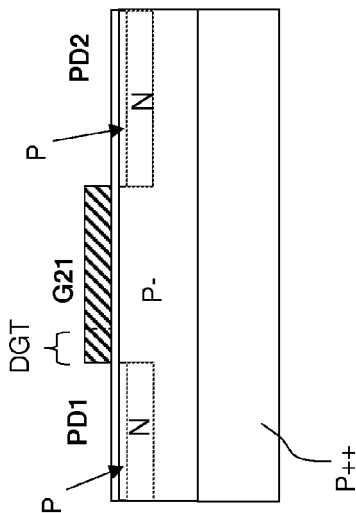
FIG. 4 shows a vertical section, along the line A-A in FIG. 3, of the temporary storage gate separating two photodiodes of adjacent pixels.

The diagram in FIG. 1 reveals a pixel that is part of a matrix sensor having multiple pixel rows and columns; each pixel has:

- a photodiode PD,
- a transfer transistor T1 that, when off, allows complete insulation between the photodiode and a charge storage node FD and then, when it is turned on, allows the charges generated in the photodiode to be transferred to the charge storage node FD; the transistor T1 is controlled by a transfer signal TRA that may be common to the whole matrix or at least common to a row of pixels;
- a transistor T2 that allows the reinitialization of the potential of the storage node before the transfer controlled by the transistor T1; when it is turned on, it brings the storage node to a reference voltage that may be the general supply potential Vdd, for example; the reinitialization control is provided on a row-by-row basis;
- a read transistor T3 connected up as a voltage follower that allows the potential that is present on the gate of this transistor to be transferred to the source; its gate is connected to the storage node FD;
- a row selection transistor T4 that connects the source of the read transistor to a column conductor CC that is common to all the pixels in one and the same column; the transistor T4 is controlled by a row conductor LS that is common to all the pixels in one and the same row; this row conductor is controlled by a selection signal SEL that emanates from a row decoder that successively addresses the various rows of pixels.

An optional transistor T5 may be provided in order to reinitialize the potential of the photodiode at the beginning of a charge integration period; to this end, this transistor is controlled by a signal GR, which is global for the whole matrix.

Conventionally, the transistors T4 in a single row of pixels are turned on, and signal reading is effected by means of double sampling: potentials representing the charge accumulation in each of the pixels in the row are individually collected on the column conductors CC, and then the potential of the storage node of the row under consideration is reinitialized and a reinitialization potential is collected on the column conductors. Reading is effected by means of the difference between the two potentials collected for each pixel.

FIG. 2 shows a top view of a possible physical configuration of the wiring diagram in FIG. 1. The elements of the diagram are formed from an active semiconductor layer that is of weakly doped P⁻ type, for example.

The photodiode PD is an N-type diffusion in this P⁻ layer, and is preferably topped with a fine superficial P-type layer that is brought to a low reference potential that is the potential of the P⁻-type semiconductor layer; it is therefore a photodiode of "pinned" type, the surface potential of which is fixed during charge integration.

The photodiode may be delimited laterally, locally or even over almost its entire periphery, by a P⁺-type layer that is deeper and more doped than the superficial layer of the photodiode. This P⁺ insulation layer is likewise brought to the potential of the semiconductor layer and serves to bring the reference potential of the P⁻ semiconductor layer to the superficial diffusion of the photodiode. The P⁺ layer is in any case interrupted over a portion of the periphery in order to permit the passage of charges (under the control of a gate) in the active layer from the photodiode to the charge storage node FD; this node is an N⁺-type diffusion in the semiconductor layer. The interruption of the P⁺ layer, between the photodiode and the storage node FD, is covered by an insulated gate G1 that is the gate of the transistor T1 in FIG. 1. The insulation between the photodiode PD and the storage node FD is provided when the gate G1 is at a low potential. The charge transfer from the photodiode to the storage node is provided when the gate G1 is at a high potential.

An insulated gate G2 (the gate of the reinitialization transistor T2 in FIG. 1) separates the storage node FD from another N⁺-type diffusion that is brought to the reference potential for reinitializing the storage node FD (in this case the supply potential Vdd). This N⁺-type diffusion serves as a drain for the transistor T2 and likewise serves as a drain for the read transistor T3; the drain of the transistor T3 is separated from its source (another N⁺ diffusion) by its gate G3; the gate G3 is electrically connected by a connection to the storage node FD. The N⁺ diffusion that serves as a source for the transistor T3 likewise serves as a drain for the selection transistor T4; the source of this transistor T4 is connected to the column conductor CC; the gate G4 of the transistor T4 separates its source from its drain. Finally, if a transistor T5 is provided in the pixel for reinitializing the potential of the photodiode, an additional gate G5 separates the photodiode from an N⁺-type drain diffusion brought to the potential Vdd; this gate covers another interruption in the P⁺ region surrounding the photodiode.

The areas of N⁺ and P⁺ type are themselves delimited by insulating regions STI in which the electrical charges cannot flow or be stored. These insulating regions are generally formed by trenches filled with insulating silicon oxide, which are made in the active Fr-type semiconductor layer. The charges flow only between the photodiode and N⁺ areas or between two N⁺ areas, on the basis of the level of potential applied to the gates that permit or prohibit this flow.

Figure 3:
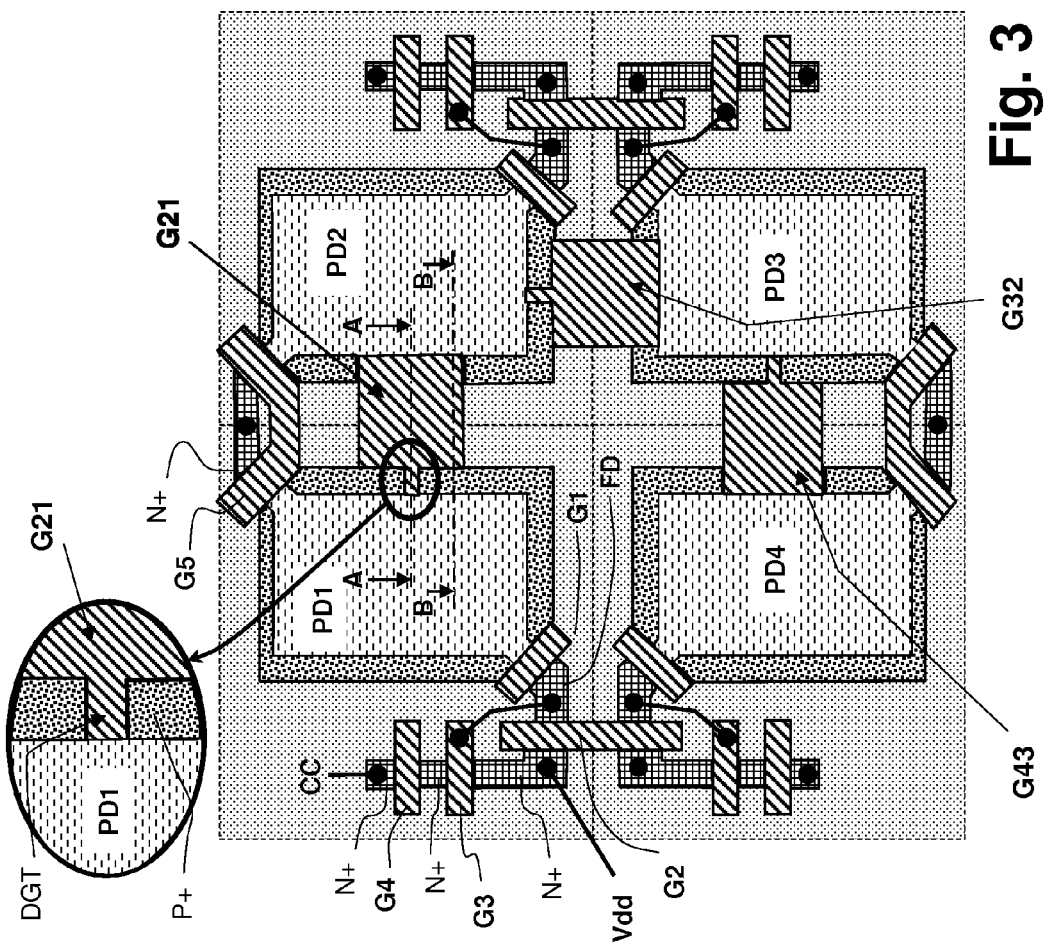
FIG. 3 shows a top view of the configuration of a group of four pixels according to the invention.

FIG. 3 shows an arrangement of four pixels according to the invention allowing either individual reading of each pixel or group reading of the four pixels. Temporary storage gates are provided between two photodiodes belonging to adjacent pixels, and these gates have the special feature of being dissymmetric in order to allow directional transfer of the charges stored under its gates to one of the photodiodes but not to the other.

As can be seen in FIG. 3, the geometries of the four pixels are preferably inverted when moving from one column to the next or from one row to the next, in order to facilitate the connections between similar elements of the various pixels. The juxtaposed diffusions of adjacent pixels that need to be connected to one and the same potential can be combined into a single diffusion extending from one pixel to the adjacent pixel. In the same way, the gates of adjacent pixels that need to be controlled by the same signal can be combined into a single gate extending from one pixel to the adjacent pixel. This is the case in FIG. 3 for the drain diffusions of the transistors T5 of two adjacent pixels in a row. This is also the case for the gates G5 of two adjacent pixels in a row, and likewise for the gates G2 of two adjacent pixels in a column; this could also be the case for the gates G1 of adjacent pixels in a column, except for when there is a wish to perform a row-by-row charge transfer to the storage nodes (charge integration mode called "rolling shutter").

According to the invention, temporary storage gates for charges are provided between at least two adjacent photodiodes. A temporary storage gate situated between two adjacent photodiodes can collect the sum of the charges generated by the two photodiodes during an integration time. To this end, a temporary storage control signal is transmitted at the end of the integration time and the charges from the two photodiodes come under the gate during this control signal. The gates are moreover set up dissymmetrically between their upstream side and their downstream side, so as to discharge, in a single one of the two photodiodes, the charges stored under the gate when the storage control signal terminates.

In the example shown, which allows four pixels to be grouped, the following have been provided:
  a gate G21 allowing the charges on the photodiodes PD1 and PD2 in a row to be grouped and to be discharged into the photodiode PD2;
  a gate G32 allowing the charges on the photodiodes PD2 and PD3 in a row to be grouped and to be discharged into the photodiode PD3;
  and a gate G43 allowing the charges on the photodiodes PD3 and PD4 in a row to be grouped and to be discharged into the photodiode PD4.

The temporary storage control signals for the three gates are transmitted in succession at the end of the integration time. The charges on the photodiode PD1 pass into the photodiode PD2; the charges accumulated in the photodiode PD2 then pass into the photodiode PD3; and finally the charges accumulated in the photodiode PD3 pass into the photodiode PD4.

Thus, after the three successive intermediate storage signals, the charges engendered in the four pixels during an integration time are grouped into the photodiode PD4. They can then be read on the column conductor corresponding to the photodiode PD4.

The temporary storage gates are situated above the active P⁻-type semiconductor layer and insulated therefrom by a fine insulating layer. The P⁺ area that surrounds each of the photodiodes is interrupted at the location of the temporary storage gate (as it is interrupted at the location of the gates G1 and G5) and the photodiode is therefore adjacent at this location to an active P⁻-type semiconductor layer portion that is covered by the temporary storage gate.

It will subsequently be considered that the geometry of the active P⁻-type layer portion covered by the temporary storage gate is the same as the geometry of the temporary storage gate itself. It is possible that the temporary gate spills over (for example above the insulation areas STI) beyond the active layer portion in which the charges can be stored, but what is important is the shape of the active layer portion that allows the charges to be stored, that is to say the active layer portion that is separated from the gate by a fine insulation layer. It is for this reason that it will subsequently be considered that there is identity between the shape of the gate and the shape of the active layer portion that can store charges under the gate, the possible overspills of the gate onto the insulation areas STI not being considered to be part of the temporary storage gate. The temporary storage gates are situated between two photodiodes, and the active layer portion topped by the gate is adjacent to the two photodiodes; by extension of vocabulary, to simplify matters it will be stated that the temporary storage gate is adjacent to a photodiode even if it is actually the active P⁻ layer portion under the gate that is adjacent to the photodiode.

The dissymmetry of the gates is obtained in the following manner: downstream photodiode (the photodiode PD2 for the gate G21) refers to the one into which the charges are discharged at the end of a temporary storage control signal; the upstream photodiode (the photodiode PD1 for the gate G21) is the one that cannot receive charges at the end of this signal; the active layer portion topped by the gate G21 is adjacent to the downstream photodiode PD2 over a greater width than where it is adjacent to the upstream photodiode PD1; the charges can therefore pass from the photodiode PD2 to the active layer portion under the gate G21 through a wide passage, but they can pass from the photodiode PD1 to the gate G21 only through a narrow corridor enclosed between P⁺-type insulation regions brought to the reference potential of the active layer. The width of this corridor is sufficiently small for the potential in this corridor to be influenced by the presence of the P⁺ area that surrounds it; by contrast, where the gate is adjacent to the downstream photodiode, the width of the passage is sufficiently large for the potential of the active layer portion not to be influenced everywhere by the presence of the P⁺ area. There may be several narrow corridors in this case provided that each of the corridors is sufficiently narrow to undergo the influence of the potential of the P⁺ regions that surround it.

The temporary storage gates G21, G32 and G43 therefore each have, as can be seen in FIG. 3, a wide side adjacent to the photodiode situated downstream and, on the upstream side, at least one narrow finger DGT having an end adjacent to the photodiode situated upstream, the finger being laterally enclosed between P⁺-type regions brought to the reference potential of the active layer.

This dissymmetry of the shape of the gate and the width of the passage between the gate and the photodiodes creates, for the narrow passage, a potential barrier at the end of the temporary storage control signal, preventing the charges from returning to the upstream photodiode, but does not create a barrier on the downstream side, which permits the charges to return to the downstream photodiode. The existence of this potential barrier will be explained in more detail further below.

FIG. 4 shows the vertical section through the temporary storage gate G21 along the line A-A in FIG. 3. The insulated gate rests on the weakly P⁻-doped active semiconductor layer portion; the photodiodes PD1 and PD2 are immediately to the left and right, respectively, of the gate. The section is taken through the narrow finger that connects the active layer portion to the upstream photodiode PD1. The N diffusion of the upstream photodiode PD1 touches the active P⁻-type layer portion under the narrow gate finger at the left-hand end of said gate and only under this narrow finger.

Figure 5:
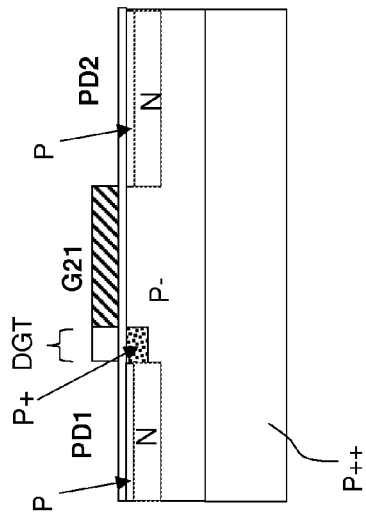
FIG. 5 shows another section of the temporary storage gate, along the line B-B in FIG. 3.

FIG. 5 shows the vertical section through the storage gate G21 along the line B-B in FIG. 3, that is to say outside the narrow finger; the N diffusion of the upstream photodiode PD1 does not touch the active P⁻-type layer portion situated under the gate because it is separated therefrom by the P⁺ region that frames the narrow finger. From the downstream photodiode, the gate advances as far as the photodiode and is adjacent thereto over the entire width of the gate.

Charges can flow from the upstream photodiode PD1 to the temporary storage gate only through the narrow corridor, the P⁺ regions are present everywhere else creating a potential barrier that prevents any passage of charges between the photodiode and the region overlooked by the gate. Charges cannot pass from the gate to the upstream photodiode, as will be seen.

FIG. 6 shows a diagram of the potentials in the semiconductor in the active semiconductor layer firstly during the charge integration time and then at the time of the application of a temporary storage signal at the end of the integration time, and finally at the end of the temporary storage signal. In the left-hand part of FIG. 6, the diagram of potentials is taken along the line A-A corresponding to FIG. 4, hence through the narrow corridor; in the right-hand part, the diagram is taken along the line B-B corresponding to FIG. 5. The potentials increase downward in accordance with the conventional representation of the potential wells and barriers for the electrons.

In the first row in FIG. 6: during the integration period, before the temporary storage signal, the gate G21 is held at a low potential that creates a potential barrier under the whole gate that prevents the passage of charges between the photodiodes PD1 and PD2. The charges generated by the light in the pixels accumulate in the photodiodes PD1 and PD2. The potential barrier is slightly higher under the narrow finger DGT than under the rest of the gate, and higher still in the P⁺ regions, but this is unimportant at this stage.

In the second row in FIG. 6: the temporary storage signal, transmitted only if there is a wish to group charges, is a niche of high potential that creates a potential well beneath the gate; this well is deeper than the potential level under the photodiode that is supposed to be empty of charges. All the charges on the photodiode PD1 discharge under the gate G21 by passing under the narrow finger (left-hand part of FIG. 6) but not elsewhere (right-hand part of FIG. 6 with a high potential barrier in the P⁺ regions). The potential in the active layer in the narrow corridor is lower than the potential under the rest of the storage gate on account of the influence of the potential of the P⁺ layer that frames this narrow corridor, but the stair that results therefrom does not prevent the passage of the charges from the photodiode PD1 to the gate G21. On the other side, the charges from the upstream photodiode PD2 also discharge into the potential well created under the gate G21, without a potential barrier.

In the third row of FIG. 6: the end of the storage signal returns the potential of the gate to a low value; the potential under the narrow finger DGT (left-hand part of FIG. 6) falls lower (higher barrier) than the potential under the gate G21 on account of the influence of the P⁺ regions that frame the narrow finger. The potential barrier that is thus created under the narrow finger has the same effect (even if it is not as high) as the barrier formed by the P+ regions (right-hand part of FIG. 6); it forces the charges to discharge from the upstream side where there is not such a barrier. All the charges pass into the photodiode PD2.

Figure 7:
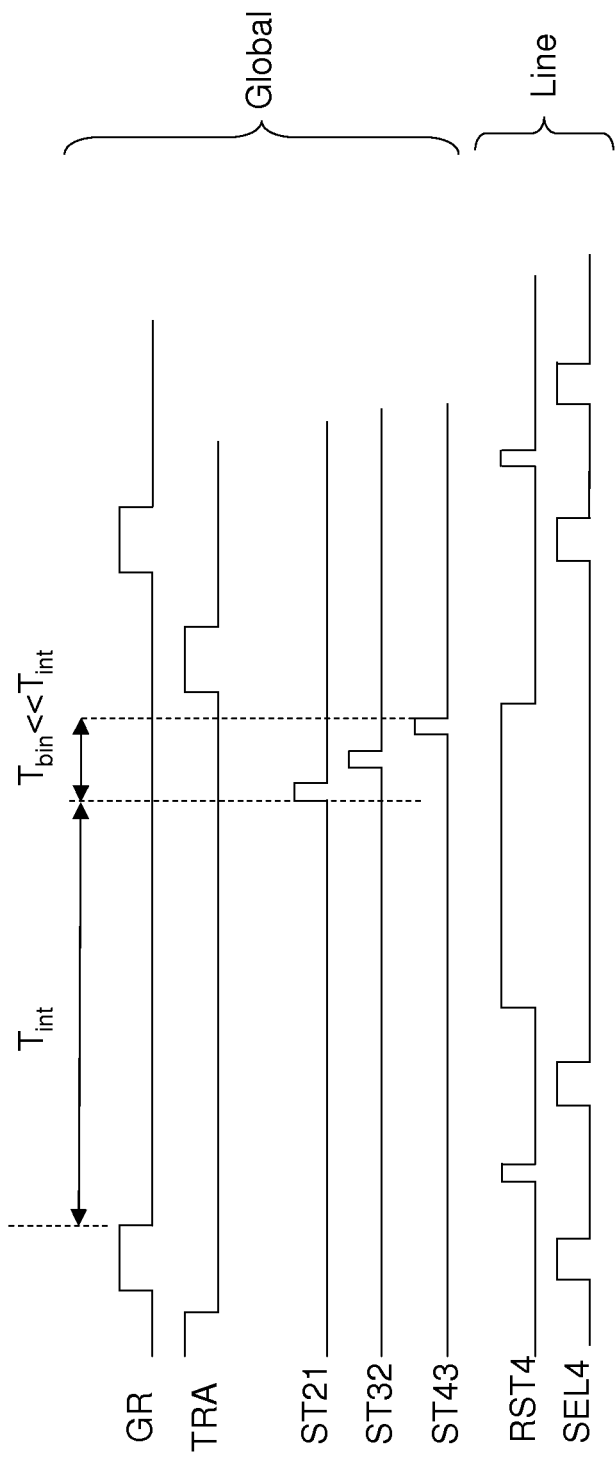
FIG. 7 shows a timing diagram of the signals applied to the pixels for reading the photogenerated charges in pixel grouping mode.

FIG. 7 shows a timing diagram of the control signals for the pixels of the matrix when there is a wish to group charges from the four pixels in FIG. 3. If there is no wish to perform grouping, the control signals are those for a conventional pixel matrix, the temporary storage gates being simply held at a low potential preventing any charge transfer between photodiodes; the pixels are read independently of one another, and each pixel addressed by a row conductor provides a potential level corresponding to its lighting on its respective column conductor.

In the case of grouping, the procedure is as follows: firstly, the charge integration remains conventional; by way of example, a global reinitialization signal GR for the photodiodes in the whole matrix is applied to the gates G5 of all the pixels. The end of this signal defines the start of an integration time. The temporary storage gates are simply held at a low potential level throughout the integration period $T_{int}$.

Just before the end of the integration time, three temporary storage pulses ST21, ST32 and ST43 are transmitted in succession, applied to the gates G21, G32 and then G43, respectively. The second pulse commences only after the first has terminated, and the third commences only after the second has terminated. Each pulse changes the corresponding gate from a low potential to a high potential before returning it to the low potential in accordance with the diagram in FIG. 6.

The first pulse groups the charges on the photodiodes PD1 and PD2 into the photodiode PD2; the second groups the charges on the photodiodes PD1, PD2 and PD3 into the photodiode PD3; the third groups the sum of the charges on the photodiodes PD1, PD2, PD3 and PD4 into the photodiode PD4.

These pulses are common to all the groups of four pixels in the matrix.

The grouping time $T_{bin}$ made up of these three pulses is much shorter than the integration time $T_{int}$.

After the end of the third pulse ST43, all the transfer transistors T1 of the pixels of the matrix are turned on, which puts the charges that are present in the photodiode of a pixel into the respective node for storing charges from this pixel. Since it is the photodiode PD4 that contains all the charges at this moment, it is the storage node of the fourth pixel that will collect these charges.

The grouped pixels are read by addressing the fourth pixels in each group of four. This involves selecting the row corresponding to this fourth pixel and observing the potential on the column conductor corresponding to this fourth pixel.

The reading is preferably effected by means of double sampling, successively on a row-by-row basis (one row in two for the matrix since only the fourth pixel is affected): the potential level that is present on the column conductor and that corresponds to the charges that are grouped into the photodiode of the fourth pixel in the row addressed and that are discharged is stored in the storage node for this pixel; the reinitialization transistor for the storage node in the row of pixels in question is then activated and the potential level that is present on the column conductor is stored. The difference between the two potential levels is measured and is converted to digital.

It would also be possible to operate in integration mode called "rolling shutter", where the transfer transistor is controlled on a row-by-row basis with, successively for each row: reinitialization of the storage nodes in the row, reading of the reinitialized levels, grouping of the charges into a single photodiode by the signals applied to the temporary storage gates, charge transfer to the storage node and reading of the transferred charges.

Figure 8:
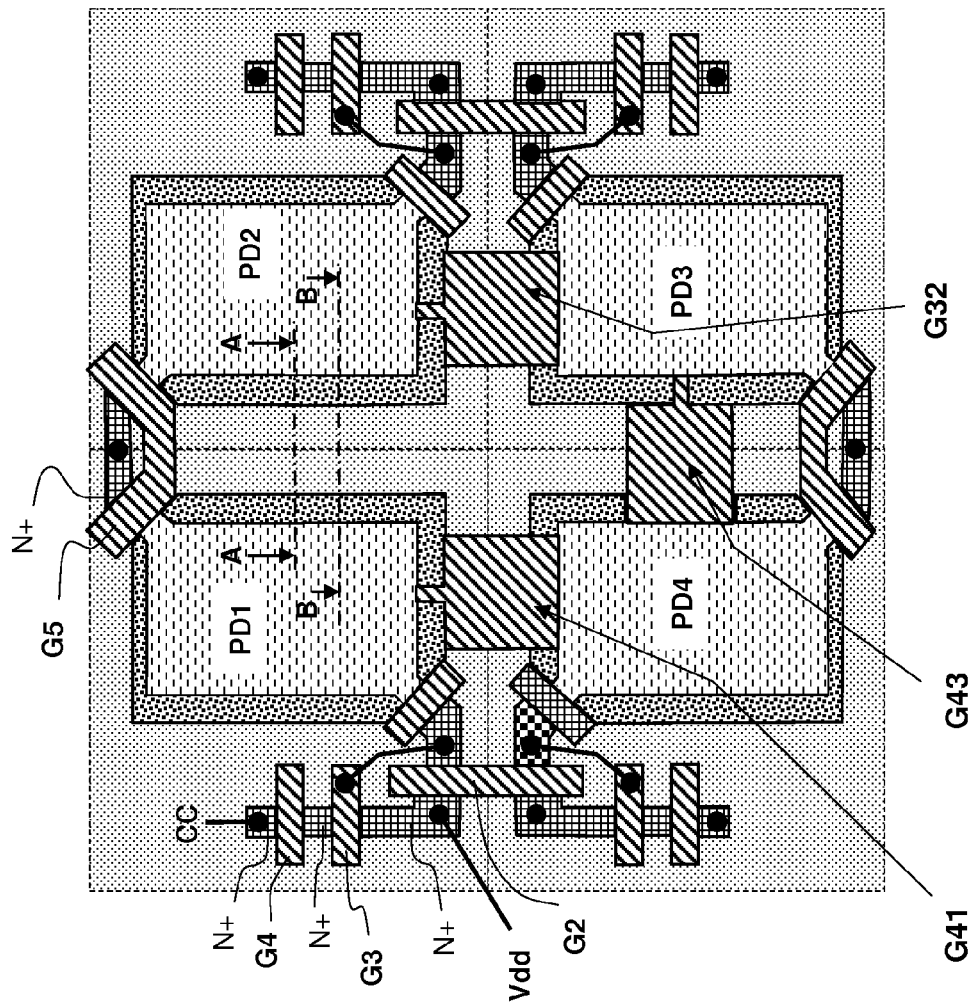
FIG. 8 shows a variant embodiment of the temporary storage gates for a group of four pixels.

In a variant embodiment that is shown in FIG. 8, there is no temporary storage gate G21 between the photodiodes PD1 and PD2, but there is a storage gate G41 between the photodiodes PD1 and PD4, the photodiode PD1 being the upstream photodiode. There are only two successive temporary storage signals; the first signal controls the gates G41 and G32 at the same time in order to group the charges on the photodiodes PD1 and PD4 into the photodiode PD4, and in order to group the charges on the photodiodes PD2 and PD3 into the photodiode PD3; the second signal controls the gate G43 as in FIG. 3 in order to group the charges on the photodiodes PD3 and PD4 into the photodiode PD4.

In the configuration of gates in FIG. 8, it would also be possible to control the gate G32 first and then to simultaneously control the gates G41 and G43.

The invention has been described for grouping of four pixels; however, it can be applied even if there is a wish to group the pixels only two by two. Therefore, a temporary storage gate between the photodiodes of the two pixels is sufficient. The invention can also be applied if there is a wish to group more than two pixels in a row and more than two pixels in a column. If there is a wish to group n×m pixels, where (n+m)>=2, it will be necessary to have (n×m−1) temporary storage gates between the photodiode of the pixel and each of the adjacent pixels. In principle, (m+n−2) successive grouping signals are needed in order to perform the grouping into the last pixel of each of the groups in the matrix.

In a general way, it is possible to provide for there to be temporary storage gates between all the adjacent pixels, even if some of these gates are not used for grouping. This makes it possible to choose grouping with a variable number of pixels by applying control signals to the gates on the basis of the desired grouping. This also allows the behavior of all the pixels to be standardized by virtue of the presence of even unused storage gates.

The invention claimed is:

1. An image sensor having a matrix of pixel rows and columns, each pixel having a photodiode and a node for storing charges in order to collect in said node, at the end of a charge integration period, charges accumulated in the photodiode, the matrix being organized into groups of at least two pixels with means for grouping into one pixel charges generated in the two pixels, wherein a group of pixels has at least one temporary storage gate for temporarily storing charges, said at least one gate exhibiting dissymmetry between an upstream side and a downstream side and being located between the photodiode of the first pixel and the photodiode of the second pixel, and means for applying to the temporary storage gate a succession of potentials that are:
   a low potential prohibiting a passage of charges between the first and second photodiodes during the charge integration period,
   then a high potential temporary storage control signal permitting a pouring towards the temporary storage gate of charges accumulated in the two photodiodes,
   then a low potential allowing a pouring towards the first photodiode only of charges stored under the temporary storage gate.

2. The image sensor as claimed in claim 1, wherein the photodiodes are produced in an active semiconductor layer of a first conductivity type and have a diffusion of a second conductivity type covered by a superficial layer of the first type connected to a reference potential for the active layer, and in wherein the temporary storage gate is arranged above an active layer portion of the first type, and is:

adjacent to the photodiode of the first pixel by an end of at least one narrow finger extending towards the photodiode of the first pixel, adjacent to the photodiode (PD2) of the second pixel by a side having a width larger than a width of the narrow finger, and, with the exception of the ends of the narrow fingers, separated from the photodiode of the first pixel by a doped insulation region of the first conductivity type, which is more doped than the superficial regions of the photodiodes, and which is brought to the potential of the active layer.

3. The image sensor as claimed in claim 2, wherein the active layer portion situated under the gate has a plurality of narrow fingers extending toward the photodiode of the first pixel and having an end adjacent to this photodiode.

4. The image sensor as claimed in claim 1, wherein the matrix is organized into groups of four pixels, a first pixel and a second pixel in a group of four being two adjacent pixels in a first row of pixels and a third and a fourth pixels in the group being two adjacent pixels in another row, adjacent to the first, and at least three dissymmetric temporary storage gates being provided in order to permit charges on the photodiodes of the four pixels to be grouped into the photodiode of the fourth pixel.

5. The image sensor as claimed in claim 4, wherein a first temporary storage gate is provided between the first and second pixels, a second gate is provided between the second and third pixels, and a third gate is provided between the third and fourth pixels, and means are provided in order to control the gates in succession, a storage control signal for the second gate being applied to the latter only after the end of a storage control signal applied to the first gate, and a storage control signal for the third gate being applied to the third gate only after the end of the storage control signal applied to the second gate.

6. The image sensor as claimed in claim 4, wherein a first temporary storage gate is provided between the first and fourth pixels, a second gate is provided between the second and third pixels, and a third gate is provided between the third and fourth pixels, and means are provided in order to control the gates in two successive steps, the storage control signal for the first gate being applied to the first gate at the same time as the storage control signal for the second gate, and the storage control signal for the third gate being applied to the third gate only after the end of the storage control signal applied to the first and second gates.

7. The image sensor as claimed in claim 1, wherein the matrix is organized into groups of n×m pixels, where (n+m) >=2 and has (n×m−1) temporary storage gates between photodiodes of adjacent pixels in order to provide for the grouping of charges from a group of n×m pixels.

8. The image sensor as claimed in claim 7, wherein means are provided for setting up n+m−2 control signals for controlling the temporary storage gates of the matrix.

* * * * *